(12) United States Patent
Nakamura et al.

(10) Patent No.: US 8,304,827 B2
(45) Date of Patent: Nov. 6, 2012

(54) SEMICONDUCTOR DEVICE HAVING ON A SUBSTRATE A DIODE FORMED BY MAKING USE OF A DMOS STRUCTURE

(75) Inventors: Yuki Nakamura, Kanagawa (JP); Koji Shirai, Kanagawa (JP); Hirofumi Nagano, Kanagawa (JP); Jun Morioka, Kanagawa (JP); Tsubasa Yamada, Kanagawa (JP); Kazuaki Yamaura, Kanagawa (JP); Yasunori Iwatsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 12/644,734

(22) Filed: Dec. 22, 2009

(65) Prior Publication Data
US 2010/0163973 A1 Jul. 1, 2010

(30) Foreign Application Priority Data

Dec. 27, 2008 (JP) ................................. 2008-335532

(51) Int. Cl.
*H01L 29/66* (2006.01)
(52) U.S. Cl. . 257/328; 257/550; 257/551; 257/E29.327; 257/E29.335; 257/E29.066
(58) Field of Classification Search .................. 257/328, 257/550, 551, E29.027, E29.066, E29.256, 257/E29.195, E29.327, E29.335
See application file for complete search history.

(56) References Cited

U.S. PATENT DOCUMENTS

| 5,818,084 | A | * | 10/1998 | Williams et al. | 257/329 |
| 6,933,559 | B1 | | 8/2005 | Van Roijen et al. | |
| 7,176,091 | B2 | * | 2/2007 | Pendharkar | 438/282 |
| 2006/0261408 | A1 | * | 11/2006 | Khemka et al. | 257/335 |
| 2007/0278568 | A1 | * | 12/2007 | Williams et al. | 257/335 |
| 2008/0237707 | A1 | | 10/2008 | Suzuki et al. | |

FOREIGN PATENT DOCUMENTS

| JP | 2000299477 | 10/2000 |
| JP | 2003017694 | 1/2003 |
| JP | 2006286800 | 10/2006 |
| JP | 2008140817 | 6/2008 |

* cited by examiner

*Primary Examiner* — Robert Huber
(74) *Attorney, Agent, or Firm* — Turocy & Watson, LLP

(57) ABSTRACT

A semiconductor device includes a diode formed by making use of a DMOS transistor structure. In addition to such a DMOS transistor structure, the semiconductor device includes a second buried layer of the first conductivity type being provided on a first buried layer of a second conductivity type that is in a floating state. Moreover, the second buried layer of the first conductivity type and a second diffusion region of the first conductive type are connected by a first diffusion region of the first conductivity type. A first electrode is set as anode, and a second electrode and a third electrode are short-circuited and set as cathode.

12 Claims, 11 Drawing Sheets

SEMICONDUCTOR DEVICE HAVING ON A SUBSTRATE A DIODE FORMED BY MAKING USE OF A DMOS STRUCTURE

CROSS-REFERENCE TO RELATED APPLICATIONS

This application is based upon and claims the benefit of priority from the prior Japanese Patent Application No. 2008-335532, filed on Dec. 27, 2008; the entire contents of which are incorporated herein by reference.

BACKGROUND OF THE INVENTION

1. Field of the Invention

The present invention relates to a semiconductor device and a method of manufacturing the same, and, more particularly to a semiconductor device having on a substrate a diode formed by making use of a double diffused metal oxide silicon (DMOS) structure and a method of manufacturing the same.

2. Description of the Related Art

Diodes have been used in various circuits for the purpose of preventing a reverse flow of an electric current. As an example of usage of the diodes, in a system employing an integrated circuit including double diffused metal oxide silicon (DMOS), a diode is interposed between the DMOS and a terminal thereof.

It is also conceivable to use a stand-alone diode as the diode and connect the stand-alone diode to the terminal of the DMOS. However, in this form, the diode is provided on the outside of a chip on which the DMOS and the like are formed. Another substrate is necessary for the diode, a setting area increases, and cost also increases. Therefore, it is desirable to use a diode-on-chip obtained by forming a diode and the like on a single chip or the same substrate.

On the other hand, in the past, a device in which different types of transistors and the like are mixedly mounted on a single chip and are isolated from each other by isolation trench is known. As such a device having different types of transistors mixedly mounted, for example, there is a Bi-CDMOS. In the Bi-CDMOS, all of a bipolar transistor, a complementary metal oxide semiconductor (CMOS), and a DMOS are realized on a single integrated chip. As an example of a DMOS as a device with high withstand voltage, there is, for example, a DMOS disclosed in Japanese Patent Application Laid-Open No. 2008-140817.

Therefore, as the diode, it is conceivable to form a diode on a substrate same as the substrate on which the Bi-CMOS is formed. However, the technology in the past for forming a diode on a substrate has problems explained below.

As a first technology in the past for forming a diode on a substrate, there is a technology for forming an N-type semiconductor layer on a P-type substrate and forming a P-type region on the N-type semiconductor layer. In the first technology in the past, although a PN diode is formed by the P-type region and the N-type semiconductor layer, at the same time, a parasitic PNP structure is formed by the PN diode and the P-type substrate. Therefore, an electric current flowing through the PN diode leaks out to the P-type substrate because of the parasitic PNP structure. Therefore, for example, when a diode is connected to a DMOS, an electric current led out from the DMOS leaks out to the P-type substrate and current ability falls. When there is a negative input to an anode terminal of the diode, in the PNP structure, the potential of the P-type substrate is relatively higher than the potential of the N-type semiconductor layer. An electric current passes from the substrate to the terminal at several volts.

As a second technology in the past for forming a diode on a substrate, there is a technology for using a silicon on insulator (SOI) substrate. Specifically, an SOI substrate obtained by forming a silicon oxide film on a silicon substrate is used and an N-type semiconductor layer and a P-type region are formed on the SOI substrate to form a PN diode. In this case, because the lower silicon substrate and the upper N-type semiconductor layer are completely divided by the silicon oxide film, an electric current does not leak out to the silicon substrate. The leakage of an electric current due to the parasitic PNP structure, which is the problem in the first technology in the past, can be prevented. In particular, an electric current tends to leak out to the substrate when a diode is used under high temperature. Therefore, the use of the SOI substrate is effective when current ability is required. However, the SOI substrate is extremely expensive compared with a normal silicon substrate.

As a third technology in the past for forming a diode on a substrate, for example, there is a technology for forming a PNP-type bipolar transistor on a P-type substrate via an N-type buried layer and making use of this PNP-type bipolar transistor structure. Specifically, an N-type buried layer is formed on a P-type substrate and a PNP-type bipolar transistor is formed on the N-type buried layer to isolate the PNP-type bipolar transistor from the P-type substrate with an N-type region including the N-type buried layer. The PNP-bipolar transistor with a collector and a base thereof short-circuited is used as a diode. In this technology in the past, the P-type substrate and the diode section are isolated by the N-type region including the N-type buried layer. When high potential is applied to the N-type buried layer, the N-type region has relatively higher potential than the P-type substrate. Therefore, leak-out of an electric current from the diode to the P-type substrate can be suppressed.

However, in the third technology in the past, a plurality of layers are laminated between the diode section and the P-type substrate. In general, in a transistor of this type, withstand voltage depends on the size in the vertical direction of a diffusing layer. Therefore, to realize high withstand voltage with this technology in the past, it is necessary to increase the thickness of the diffusing layer and, therefore, increase the thickness of a device. When the thickness of the device is increased to control withstand voltage, in particular, to create deep diffusion for ensuring high withstand voltage, an apparatus that injects ions into silicon at ultrahigh acceleration voltage is necessary. However, this is technically difficult depending on the magnitude of withstand voltage.

BRIEF SUMMARY OF THE INVENTION

According to an aspect of the present invention, a semiconductor device includes a substrate of a first conductivity type, a first buried layer of a second conductivity type formed in a device formation region on the substrate, a second buried layer of the first conductivity type formed on the first buried layer, an epitaxial layer of the second conductivity type formed on the second buried layer, a first diffusion region of the first conductivity type that are formed on the second buried layer and surround the epitaxial layer, a second diffusion region of the first conductive type, at least a part of which is formed on the first diffusion region, a third diffusion region of the first conductivity type formed on the second diffusion region, a first electrode formed on the third diffusion region, a fourth diffusion region of the second conductivity type, at least a part of which is formed in the epitaxial layer, a fifth diffusion region of the first conductivity type and a sixth diffusion region of the second conductivity type formed on the fourth diffusion region, a second electrode formed on the fifth diffusion region and the sixth diffusion region, and a third electrode formed above the epitaxial layer and short-circuited with the fifth diffusion region and the sixth diffusion region via the second electrode, wherein the first buried layer is in a floating state.

According to an aspect of the present invention, a semiconductor device includes a substrate of a first conductivity type, a first buried layer of a second conductivity type formed in a device formation region on the substrate, a second buried layer of the first conductivity type formed on the first buried layer, an epitaxial layer of the second conductivity type formed on the second buried layer, a first diffusion region of the first conductivity type that are formed on the second buried layer and surround the epitaxial layer, a second diffusion region of the first conductive type, at least a part of which is formed on the first diffusion region, a third diffusion region of the first conductivity type formed on the second diffusion region, a first electrode formed on the third diffusion region, a fourth diffusion region of the second conductivity type, at least a part of which is formed in the epitaxial layer, a fifth diffusion region of the first conductivity type and a sixth diffusion region of the second conductivity type formed on the fourth diffusion region, a second electrode formed on the fifth diffusion region and the sixth diffusion region, a third electrode formed above the epitaxial layer and short-circuited with the fifth diffusion region and the sixth diffusion region via the second electrode, and a semiconductor region of the second conductivity type formed to surround the first diffusion region and formed to extend from the first buried layer to a surface of the device formation region, wherein voltage is applied from a surface of the semiconductor region to the first buried layer to set potential of the first buried layer higher than potential of the substrate and the second buried layer.

According to an aspect of the present invention, a method of manufacturing a semiconductor device includes sequentially laminating, on a substrate of a first conductivity type, a first buried layer of a second conductivity type, a second buried layer of the first conductivity type, an epitaxial layer of the second conductivity type, forming a seventh diffusion region of the second conductivity type in a center of the epitaxial layer on the second buried layer and forming a first diffusion region of the first conductivity type on the second buried layer to surround the epitaxial layer, forming a second diffusion region of the first conductivity type such that at least a part thereof is arranged on the first diffusion region, forming a third diffusion region of the first conductivity type on the second diffusion region, forming a fourth diffusion region of the second conductivity type in the epitaxial layer and the seventh diffusion region to extend over both the epitaxial layer and the seventh diffusion region, forming a third diffusion region of the first conductivity type on the second diffusion region and forming a fifth diffusion region of the first conductivity type and a sixth diffusion region of the second conductivity type on the fourth diffusion region, forming a first electrode on the third diffusion region and forming second electrodes on the fifth diffusion region and the sixth diffusion region, forming a third electrode above the epitaxial layer and short-circuiting the third electrode and the fifth and sixth diffusion regions via the second electrodes, and keeping the first buried layer in a floating state.

DETAILED DESCRIPTION OF THE INVENTION

Exemplary embodiments of semiconductor device and method of manufacturing the same according to the present invention will be explained below in detail with reference to the accompanying drawings. The present invention is not limited to the following embodiments.

Figure 1:
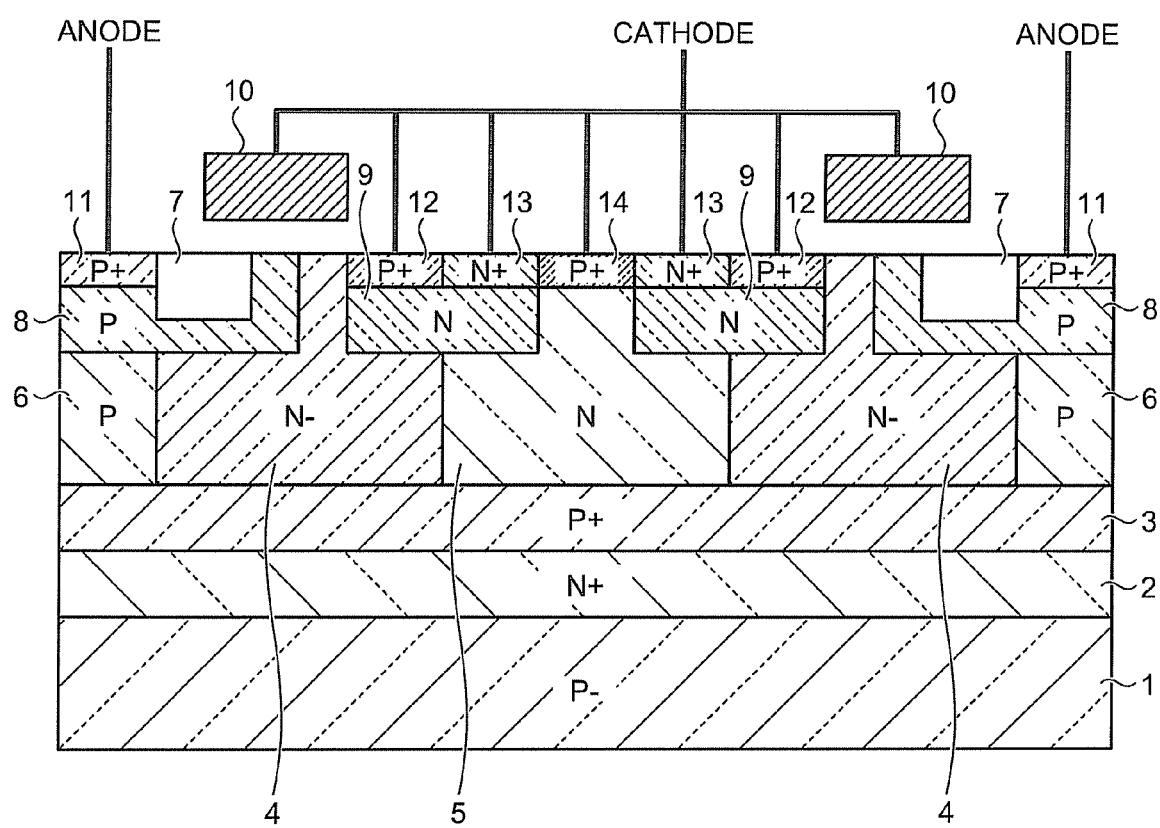
FIG. 1 is a sectional view of the configuration of a semiconductor device according to a first embodiment of the present invention in which a diode is formed on a substrate by making use of a P-channel DMOS structure.

FIG. 1 is a sectional view of the configuration of a semiconductor device according to a first embodiment of the present invention in which a diode is formed on a substrate by making use of a P-channel DMOS structure. In FIG. 1, a semiconductor device formed in a device formation region isolated from other regions by being surrounded by deep trench isolation (DTI) shown in FIGS. 4 and 5 explained later is shown. As shown in FIG. 1, an N-type buried layer 2 as a first buried layer and a P-type buried layer 3 as a second buried layer are formed in this order on a P-type substrate 1 as a P-type silicon substrate. The N-type buried layer 2 is in a floating state. Specifically, voltage is not directly applied to the N-type buried layer 2. The N-type buried layer 2 is not grounded. Even if a terminal is provided in the N-type buried layer 2, the terminal is opened and is not connected to other terminals.

On the P-type buried layer 3, N-type epitaxial layers 4, an N-type diffusion region 5 as a seventh diffusion region surrounded by the N-type epitaxial layers 4, and P-type diffusion layers 6 as first diffusion layers formed to surround an N-type region including the N-type epitaxial layers 4 and an N-type diffusion layer 5. The N-type diffusion layer 5 and the P-type diffusion layers 6 require deep diffusion and form an isolation region. The N-type diffusion layer 5 is provided mainly for a purpose of measures against electric field concentration and a surge. By providing the N-type diffusion layer 5, a diffusion layer is formed downward from the surface thereof. This makes it possible to direct the concentration of electric fields to a lower layer. There is an effect that a surge is allowed to pass to the P-type substrate 1. The N-type diffusion layer 5 is formed in a source section and the P-type diffusion layers 6 are formed in drain sections. Shallow trench isolation (STI) 7 as first trench, which is formed from the surface of the device formation region, is formed above the N-type epitaxial layers 4. In plan view from a direction perpendicular to the P-type substrate 1, the STI 7 is formed adjacent to the P-type diffusion layers 6 and forms isolation regions by shallow trenches.

The P-type diffusion layer 8 as a second diffusion region is formed over the P-type diffusion layers 6 to the N-type epitaxial layers 4 and arranged on the surface of the device formation region. On the P-type diffusion layers 8, P-type diffusion layers 11 as third diffusion regions are formed. In this structure, a drain region has a double diffused drain structure. On the P-type diffusion layers 11, not-shown drain electrodes as first electrodes are formed. The P-type diffusion layers 11 are regions having higher impurity concentration compared with the P-type diffusion layers 8.

In this way, the P-type diffusion layers 11, 8, and 6 are formed to be laminated from the surface of the device formation region to the surface of the P-type buried layer 3. The P-type diffusion layers 11, 8, and 6 are formed to surround an N-type region (the N-type epitaxial layers 4 and the N-type diffusion layer 5) together with the P-type buried layer 3. The STI 7 is formed in regions formed by the P-type diffusion layers 8 and the P-type diffusion layers 11.

In the N-type epitaxial layers 4 and the N-type diffusion layers 5, N-type diffusion layers 9 as fourth diffusion regions are formed to extend over both the layers. On the N-type diffusion layers 9, P-type diffusion layers 12 as fifth diffusion regions and N-type diffusion layers 13 as sixth diffusion regions are formed adjacent to each other. The P-type diffusion layers 12 are formed on the N-type epitaxial layers 4 sides and the N-type diffusion layers 13 are formed on the N-type diffusion layer 5 side. The P-type diffusion layers 12 and the N-type diffusion layers 13 are regions having higher impurity concentration compared with the N-type diffusion layers 9.

A P-type diffusion layer 14 as an eighth diffusion region is formed on the N-type diffusion layer 5 and formed in a region adjacent to and between the N-type diffusion layers 13. Like the P-type diffusion layers 12 and the N-type diffusion layers 13, the P-type diffusion layer 14 forms a shallow and dense diffusion layer. On the P-type diffusion layers 12, the N-type diffusion layers 13, and the N-type diffusion layer 14, not-shown source electrodes as second electrodes are formed.

Impurity concentrations of the P-type diffusion layers 11, the P-type diffusion layers 12, the N-type diffusion layers 13, and the P-type diffusion layer 14 are, for example, 1E15 to 1E16 [1/cm] in dosages. Impurity concentrations of the N-type diffusion layer 5, the P-type diffusion layers 6, the P-type diffusion layers 8, and the N-type diffusion layers 9 are, for example, 1E12 to 1E14 [1/cm] in dosages. Impurity concentrations of the N-type buried layer 2 and the P-type buried layer 3 are for example, 1E14 to 1E16 [1/cm] in dosages. Impurity concentrations of the N-type epitaxial layers 4 and the P-type substrate 1 are lower by several digits in dosages compared with the impurity concentrations of these regions.

Gate electrodes 10 as third electrodes are formed between the source section and the drain sections and above the N-type epitaxial layers 4 via not-shown gate insulating films. In FIG. 1, a pair of transistor structures are formed symmetrically with respect to the N-type diffusion layer 5 arranged in the center of the device formation region.

A DMOS transistor structure mainly includes the P-type substrate 1, the N-type buried layer 2, the N-type epitaxial layers 4, the P-type diffusion layers 8 and 11, the N-type diffusion layers 9 and 13, the P-type diffusion layers 12, and the gate electrodes 10. The DMOS transistor structure is a P-channel DMOS structure. This P-channel DMOS transistor is a device for high withstand voltage. High withstand voltage can be realized by expanding lateral width of the P-channel DMOS transistor.

In this embodiment, in addition to such a DMOS transistor structure, the P-type buried layer 3 is provided to be laminated on the N-type buried layer 2. The P-type buried layer 3 and the P-type diffusion layers 8 are connected by the P-type diffusion layers 6 diffused in the vertical direction. The N-type region (the N-type epitaxial layers 4 and the N-type diffusion layer 5) is surrounded by these P-type regions.

In FIG. 1, the P-channel DOS structure with drains set as anodes and sources and the gate electrodes 10 short-circuited and set as a cathode is used as a diode. As shown in FIG. 1, connection lines on the anode sides are led out from the P-type diffusion layers 11 via not-shown drain electrodes. The gate electrodes 10, the P-type diffusion layers 12, the N-type diffusion layers 13, and the P-type diffusion layer 14 are connected to one another via not-shown source electrodes. Connection lines on the cathode side are led out from these regions.

Not-shown terminals are respectively provided on the connection line on the anode side and the connection line on the cathode side. Positive voltage is applied to the terminal on the anode side and negative voltage is applied to the terminal on the cathode side, whereby an electric current in a forward direction flow from the anode to the cathode.

FIGS. 2A and 2B and FIGS. 3A and 3B are sectional views for explaining a method of manufacturing a semiconductor device according to this embodiment. A manufacturing process is shown in the figured in order of FIGS. 2A, 2B, 3A, and 3B.

Figure 2A:
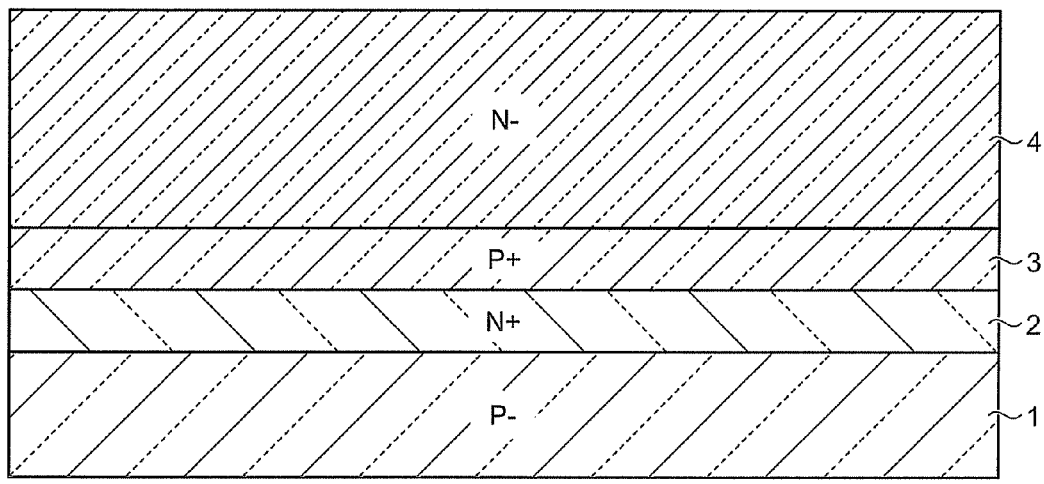
FIGS. 2A and 2B are sectional views for explaining a method of manufacturing a semiconductor device according to the first embodiment.

First, as shown in FIG. 2A, N-type ions and P-type ions are implanted on the P-type substrate 1 to form the N-type buried layer 2 and the P-type buried layer 3 in order. The N-type epitaxial layer 4 is formed on the P-type buried layer 3.

Figure 2B:
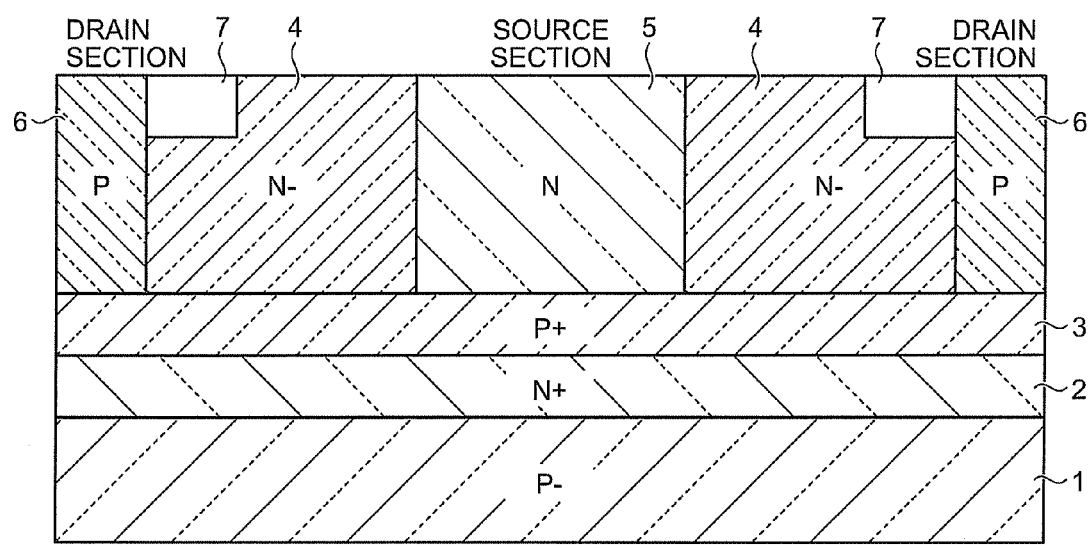

In FIG. 2B, the N-type diffusion layer 5 and the P-type diffusion layers 6 both requiring deep diffusion are formed on the P-type buried layer 3. The STI 7 formed by shallow trenches is formed on the N-type epitaxial layers 4. The N-type diffusion layer 5 is formed in the source section and the P-type diffusion layers 6 are formed in the drain sections. The P-type diffusion layers 6 and the P-type buried layer 3 are formed to surround the N-type region of the source section.

Figure 3A:
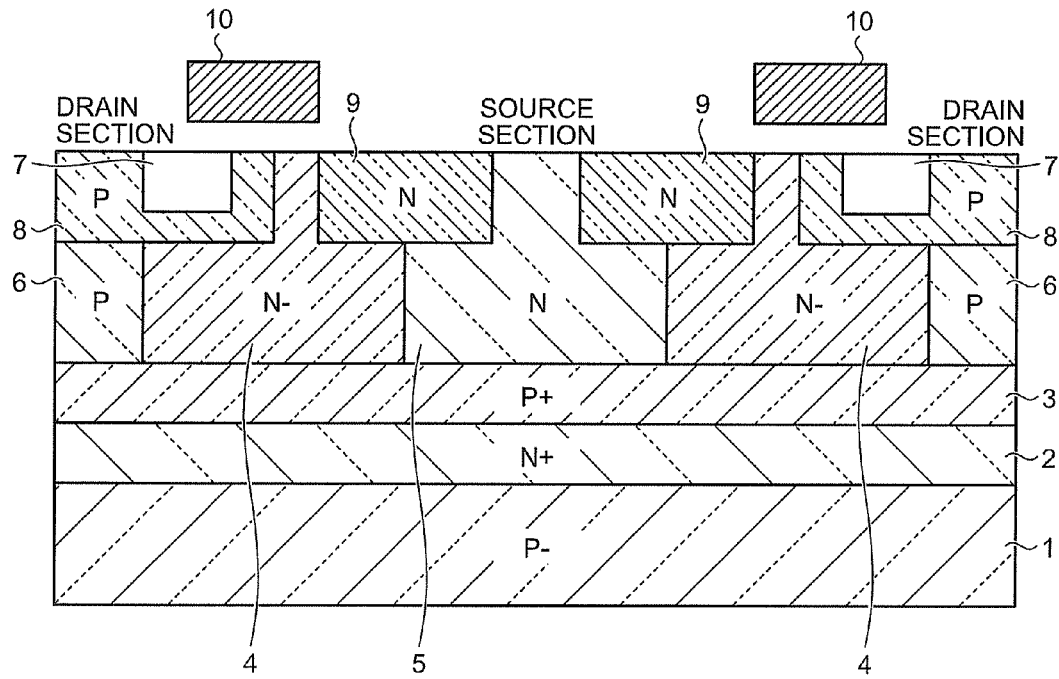
FIGS. 3A and 3B are sectional views for explaining the method of manufacturing a semiconductor device following FIGS. 2A and 2B.

Subsequently, as shown in FIG. 3A, the N-type diffusion layers 9 are formed in the source section and the P-type diffusion layers 8 are formed in the drain sections. The gate electrodes 10 are formed via the not-shown gate insulating films. The P-type diffusion layers 8 are formed over the P-type diffusion layers 6 and the N-type epitaxial layers 4 from the surface of the device formation region. The STI 7 is arranged in the P-type diffusion layers 8. The N-type diffusion layers 9 are formed in the N-type epitaxial layers 4 and the N-type diffusion layer 5 to extend over the N-type epitaxial layers 4 and the N-type diffusion layer 5.

Figure 3B:
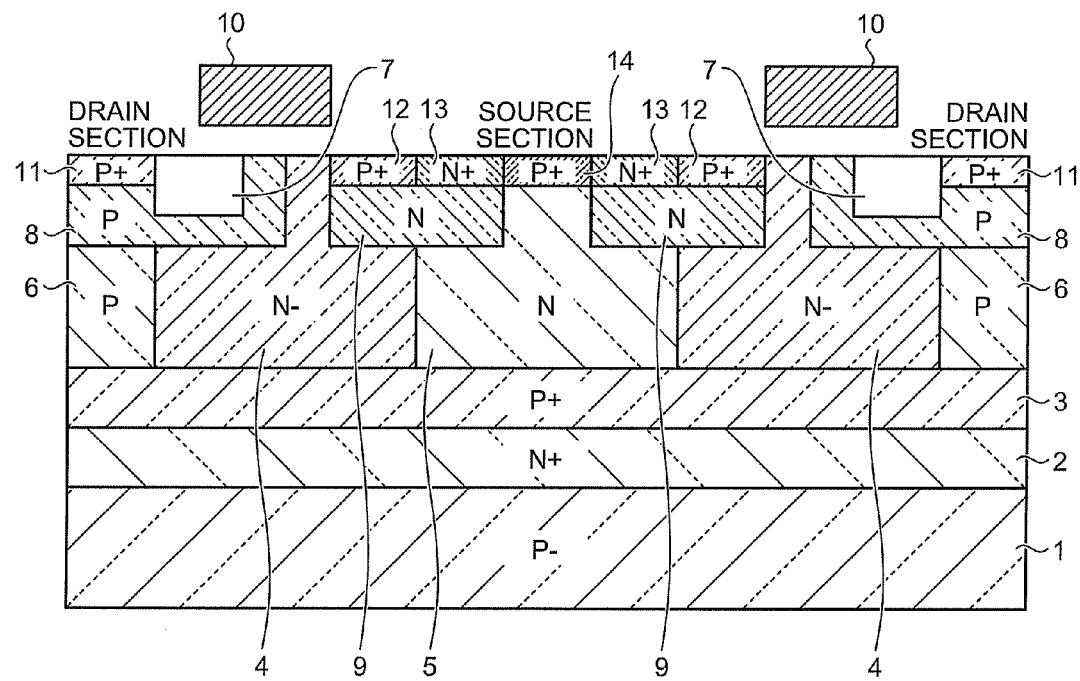

As shown in FIG. 3B, N-type and P-type shallow and dense diffusion layers, i.e., the P-type diffusion layers 11, 12, and 14 and the N-type diffusion layers 13 are formed. The P-type diffusion layers 11 are formed on the P-type diffusion layers 8, both of the P-type diffusion layers 12 and the N-type diffusion layers 13 are formed on the N-type diffusion layers 9, and the P-type diffusion layer 14 is formed on the N-type diffusion layer 5. The not-shown source electrodes are formed on the P-type diffusion layers 12, the N-type diffusion layers 13, and the P-type diffusion layer 14. The not-shown drain electrode is formed on the P-type diffusion layer 11. The gate electrodes 10 are formed above the N-type epitaxial layers 4.

Finally, as shown in FIG. 1, the drain sections of this P-channel DMOS structure are set as the anodes and the source section and the gate electrodes 10 are short-circuited and set as the cathode to form a diode. According to the process explained above, the diode can be formed on the P-type substrate 1.

According to this embodiment, because the diode is formed by making use of the DMOS, withstand voltage of which depends on parameters in the horizontal direction (a width direction of a substrate), it is possible to provide a diode that guarantees high withstand voltage by adjusting the parameters in the horizontal direction. Therefore, unlike the past, because the withstand voltage of the diode formed on the substrate does not depend on parameters in the vertical direction (a thickness direction of the substrate), in particular, the thickness of diffusion layers, the problem in that the thickness of a device has to be increased to secure high withstand voltage is prevented.

In this embodiment, the N-type buried layer 2 and the P-type buried layer 3 are laminated on the P-type substrate 1 and the N-type buried layer 2 is set in a floating state to isolate the P-type regions of the anodes and the N-type regions of the cathode from the P-type substrate 1. Therefore, it is possible to suppress a parasitic current to the P-type substrate 1 and provide a diode in which leakage of an electric current to the P-type substrate 1 is suppressed. Because the N-type buried layer 2 is set in the floating state, it is unnecessary to lead out wires from the N-type buried layer 2. Therefore, because a wire lead-out section is reduced, it is possible to reduce an area of the device formation region and hold down a capacity (compared with FIGS. 9 and 11 referred to later).

According to this embodiment, even when there is a negative input to the terminal of the anode, because the floating N-type buried layer 2 is present between the P-type substrate 1 and the diode, an electric current is suppressed from passing from the P-type substrate 1 to the terminals.

Because the N-type diffusion layer 5 is provided on the P-type buried layer 3, the diffusion region is formed downward from the surface thereof. This makes it possible to direct concentration of electric fields to a lower layer and allow a surge to easily pass to the P-type substrate 1.

In this embodiment, in addition to the PN structure of the diode, the PNP transistor structure including the P-type diffusion layers 8, the N-type epitaxial layers 4, and the P-type diffusion layers 12 is formed. Therefore, because the PNP transistor structure operates in cooperation, there is an effect it is possible to feed a larger electric current and current ability is improved.

Therefore, according to this embodiment, by forming a transistor making use of the DMOS structure, it is possible to improve current ability per an area after securing withstand voltage. When the current ability per an area is compared with that in the past, this embodiment can realize, for example, ability twice or more as large as that in the past.

In this embodiment, the configuration example of the diode that makes use of the P-channel DMOS structure formed on the P-type substrate 1 is explained. A diode that has the opposite conductivity type, i.e., a diode that is formed on an N-type substrate and makes use of an N-channel DMOS structure can be configured in the same manner. The same holds true in embodiments explained below.

Figure 10:
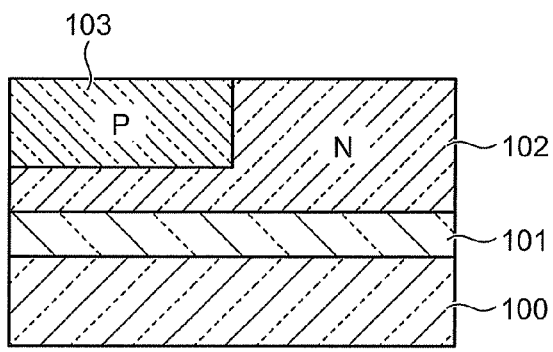
FIG. 10 is a diagram of an example of the configuration of a diode in the past formed on a substrate.
Figure 11:
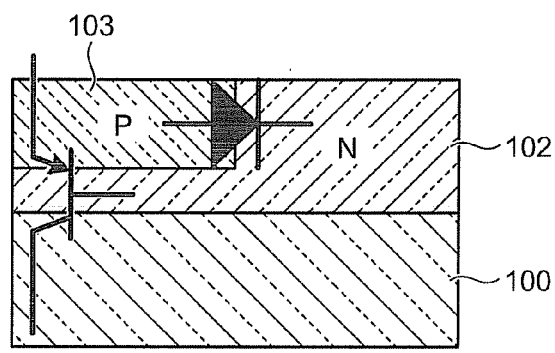
FIG. 11 is a diagram of another example of the configuration of the diode in the past formed on the substrate.
Figure 12:
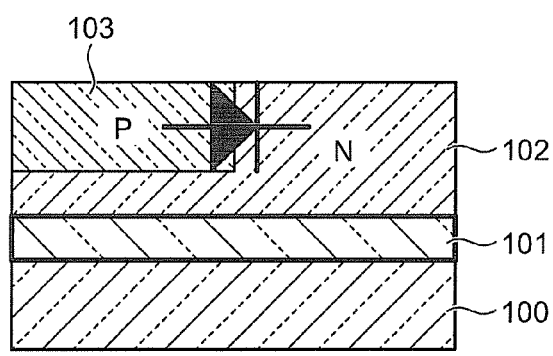
FIG. 12 is a diagram for explaining a diode structure formed by the configuration shown in FIG. 10.

FIG. 10 is a diagram of an example of the configuration of a diode in the past formed on a substrate, in particular, the configuration of a diode including a silicon on insulator (SOI) substrate. FIG. 11 is a diagram of another example of the configuration of the diode in the past formed on the substrate. FIG. 12 is a diagram for explaining a diode structure formed by the configuration shown in FIG. 10.

First, in the example shown in FIG. 11, an N-type semiconductor layer 102 is formed on a P-type substrate 100 and a P-type semiconductor region 103 is formed in the N-type semiconductor layer 102. In this case, a PN diode structure is formed by the P-type semiconductor region 103 and the N-type semiconductor layer 102. At the same time, a parasitic PNP structure is formed by the P-type semiconductor region 103, the N-type semiconductor layer 102, and the P-type substrate 100. In FIG. 11, a circuit diagram of the PN diode and a circuit of the parasitic PNP structure as a PNP-type transistor structure are shown to overlap a semiconductor layer structure (FIGS. 12 and 13 are the same). Therefore, with the configuration shown in FIG. 11, an electric current flowing through the PN diode leaks out to the P-type substrate 100 via the parasitic PNP structure. On the other hand, in this embodiment, the floating N-type buried layer 2 is buried between the P-type buried layer 3 and the P-type substrate 1. This makes it possible to suppress a parasitic current to the P-type substrate 1 and provide a diode in which leakage of an electric current to the P-type substrate 1 is suppressed.

In FIG. 11, when there is a negative input to an anode terminal (i.e., the P-type semiconductor region 103) of the diode, the potential of the P-type substrate 100 is relatively higher than the potential of the N-type semiconductor layer 102 and an electric current passes from the P-type substrate 100 to the terminal even at applied voltage of about several volts because of characteristics of PN junction. On the other hand, in this embodiment, because the floating N-type buried layer 2 is present between the P-type substrate 1 and the diode, an electric current is suppressed from passing from the P-type substrate 1 to the terminal.

In FIGS. 10 and 12, an example in the past in which a diode is formed on a substrate by using an SOI substrate is shown. A silicon oxide film (SiO2) 101 is formed on the P-type substrate 100, the N-type semiconductor layer 102 is formed on the silicon oxide film 101, and the P-type semiconductor region 103 is formed in the N-type semiconductor layer 102. With this configuration, a PN diode structure is formed by the P-type semiconductor region 103 and the N-type semiconductor layer 102. In this case, because the lower P-type substrate 100 and the upper N-type semiconductor layer 102 are completely divided by the silicon oxide film 101, a parasitic PNP structure is not formed. When an electric current is fed to the PN diode, the electric current does not leak out to the P-type substrate 100. However, the SOI substrate is extremely expensive compared with a normal silicon substrate. It is costly to form a diode using the SOI substrate. On the other hand, in this embodiment, such a problem of cost does not occur because the SOI substrate is not used.

Figure 13A:
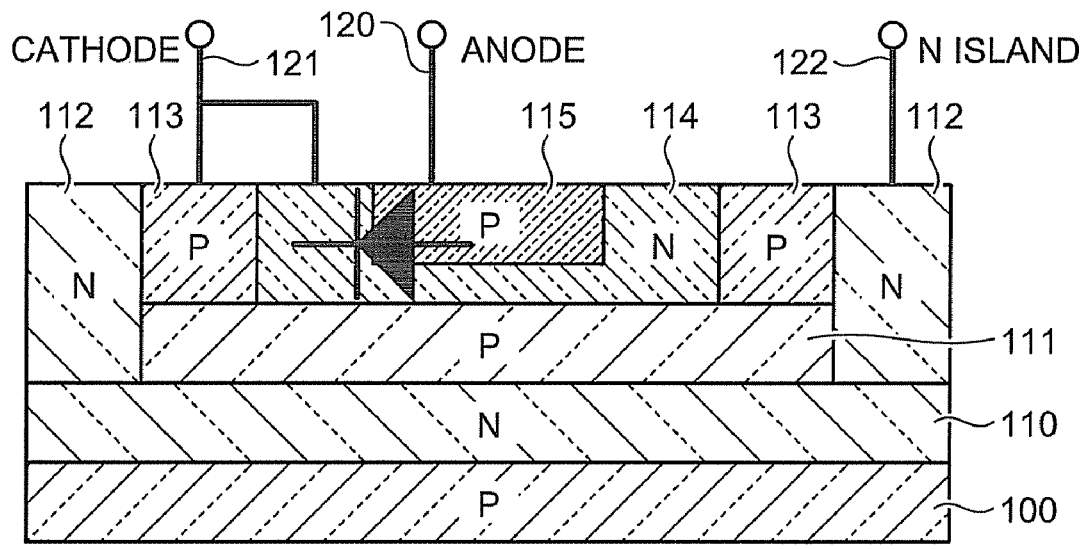
FIGS. 13A and 13B are diagrams of still another example of the configuration of the configuration of the diode in the past formed on the substrate.
Figure 13B:
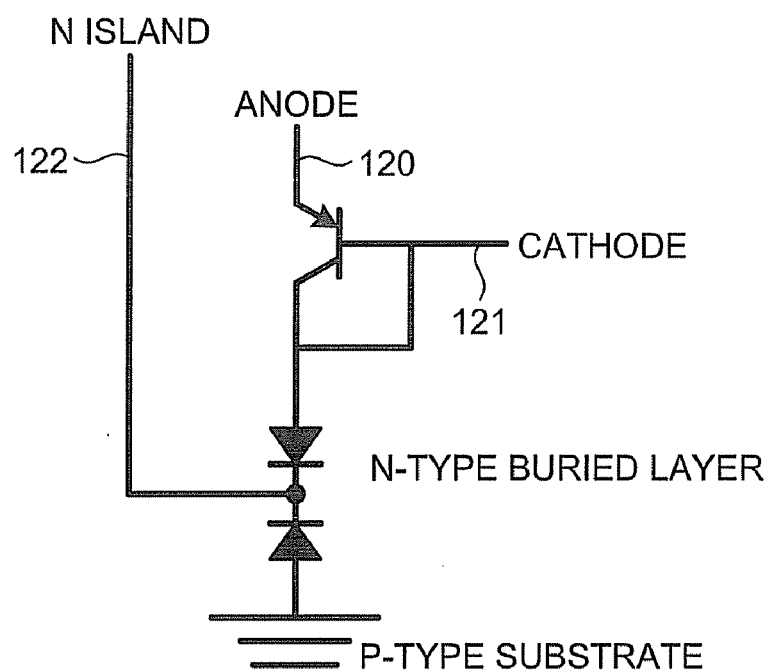

FIGS. 13A and 13B are diagrams of another example of the configuration of the diode in the past formed on the substrate. FIG. 13A is a sectional view and FIG. 13B is a circuit diagram equivalent to the sectional view.

As shown in FIG. 13A, an N-type buried layer 110 is formed on the P-type substrate 100. A P-type buried layer 111, N-type diffusion layers 112, P-type diffusion layers 113, an N-type diffusion layer 114, and a P-type diffusion layer 115 are formed on the N-type buried layer 110. A PNP-type bipolar transistor is formed by the P-type diffusion layer 115, the N-type diffusion layer 114, the P-type buried layer 111, and the P-type diffusion layers 113. The PNP-type bipolar transistor is isolated from the P-type substrate 100 by an N-type region including the N-type buried layer 110 and the N-type diffusion layers 112. The PNP-type bipolar transistor with a collector and a base thereof short-circuited can be used as a diode. Specifically, as shown in FIGS. 13A and 13B, a connection line 120 led out from the P-type diffusion layer 115 is an anode and a connection line 121 led out from a connection line for short-circuiting the N-type diffusion layer 114 and the P-type diffusion layers 113 is a cathode. With this configuration, a voltage is applied to the N-type buried layer 110 via a connection line 122 connected to the N-type diffusion layer 112 to keep the N-type buried layer 110 in a higher-potential state with respect to the P-type substrate 100. Consequently, an electric current does not flow from the P-type buried layer 111 to the P-type substrate 100 through the N-type buried layer 110. It is possible to prevent leak-out of an electric current to the P-type substrate 100 due to a parasitic PNP structure.

However, in the example in the past shown in FIGS. 13A and 13B, a plurality of layers that isolate the diode section and the P-type substrate 100 are laminated between the diode section and the P-type substrate 100. In a transistor of this type, in general, withstand voltage depends on the size in the vertical direction of a diffusion layer. Therefore, to realize high withstand voltage with this technology in the past, it is necessary to increase the thickness of the diffusion layer, i.e., increase the thickness of the device. However, in a method of increasing the thickness of the diffusion layer and controlling withstand voltage, depending on the magnitude of the withstand voltage, the formation of deep diffusion equivalent to the withstand voltage involves a technical difficulty. On the other hand, in this embodiment, because the diode is formed by making use of the P-channel DMOS structure as shown in FIG. 1, a withstand voltage characteristic of the diode is the same as a withstand voltage characteristic of a DMOS transistor. Therefore, it is possible to realize high withstand voltage by adjusting parameters in the horizontal direction without increasing the thickness of the device.

Figure 4:
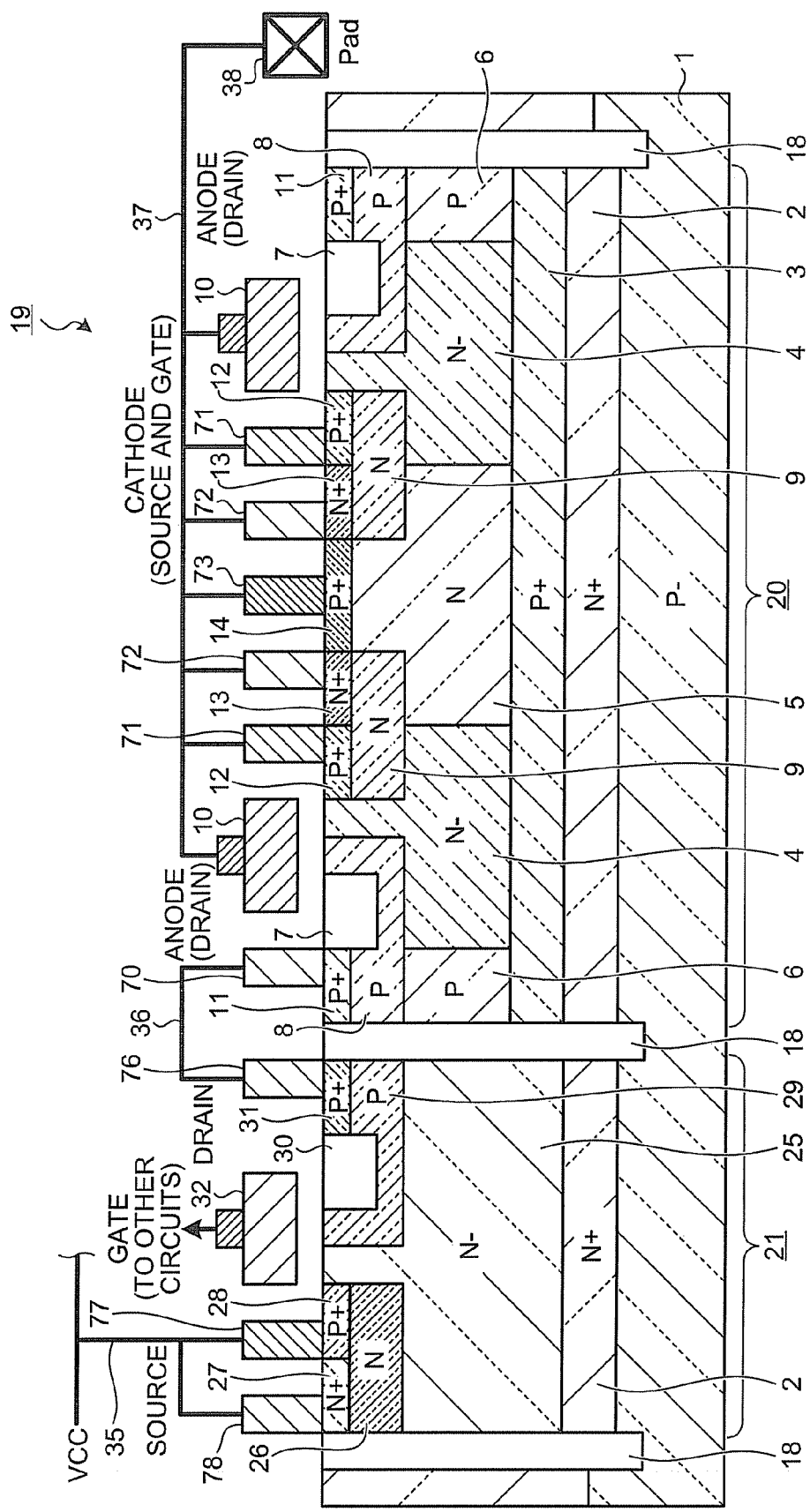
FIG. 4 is a diagram of an example of the sectional configuration of a semiconductor device according to a second embodiment of the present invention.
Figure 5:
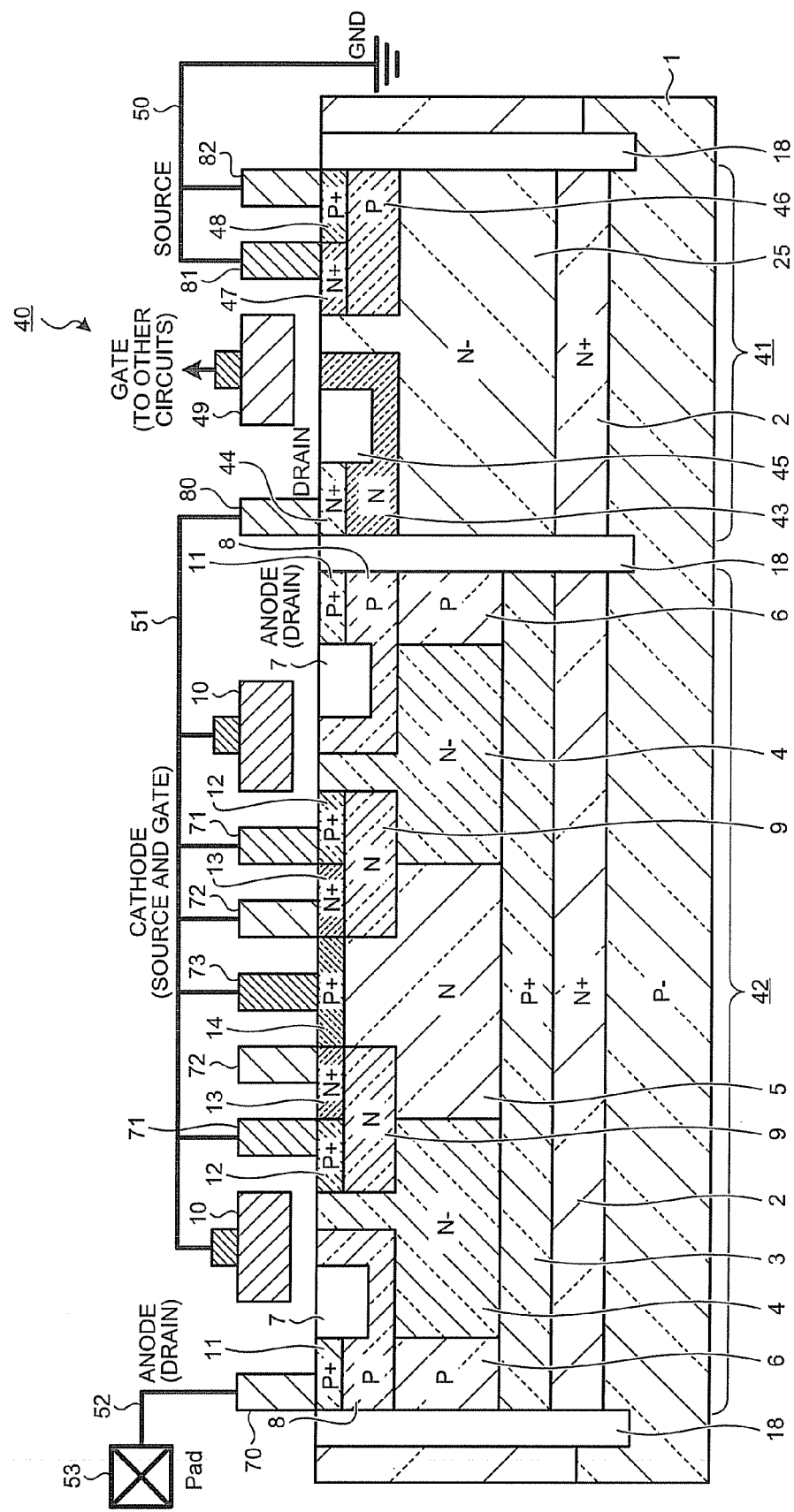
FIG. 5 is a diagram of another example of the sectional configuration of the semiconductor device according to the second embodiment.
Figure 6:
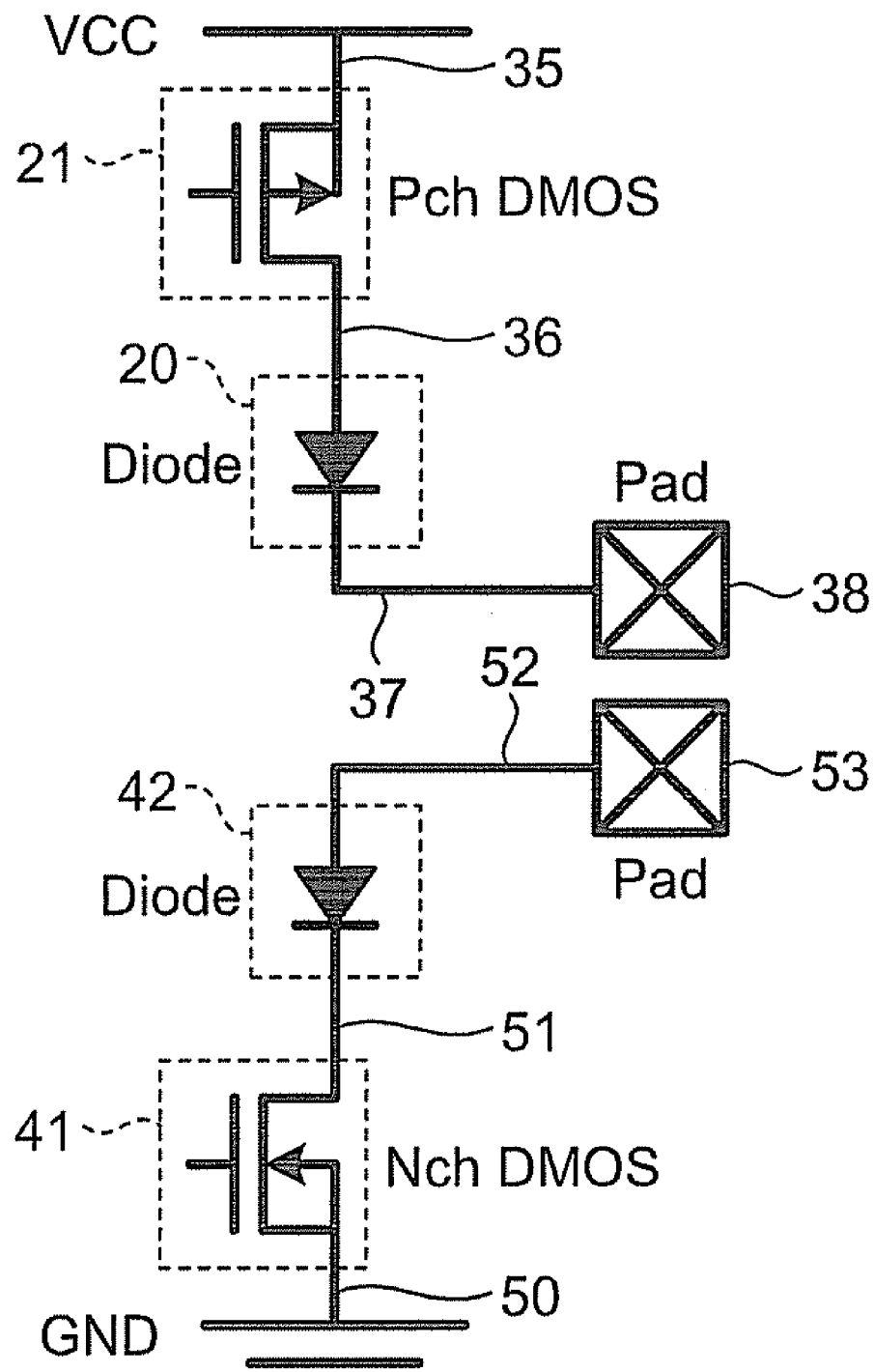
FIG. 6 is a circuit diagram of a configuration obtained by combining the configurations shown in FIGS. 4 and 5.

FIG. 4 is a diagram of an example of the sectional configuration of a semiconductor device according to a second embodiment of the present invention. In FIG. 4, the diode according to the first embodiment and a P-channel DMOS are mixedly mounted on the same substrate. FIG. 5 is a diagram of another example of the sectional configuration of the semiconductor device according to this embodiment. In FIG. 5, the diode according to the first embodiment and an N-channel DMOS are mixedly mounted on the same substrate. In a semiconductor device 19 shown in FIG. 4, a device is connected to a terminal of a cathode of the diode. In a semiconductor device 40 shown in FIG. 5, a device is connected to a terminal of an anode of the diode. FIG. 6 is a circuit diagram of a configuration obtained by combining the configurations shown in FIGS. 4 and 5.

As shown in FIG. 4, two regions isolated from each other by deep trench isolation (DTI) 18 as second trench are formed on the P-type substrate 1. A diode 20 according to the first embodiment is mounted on one region and a P-channel DMOS transistor 21 is mounted on the other region. Because the diode 20 is the same as the diode already explained with reference to FIG. 1, the same components are denoted by the same reference numerals and signs and explanation of the components is omitted. A drain electrode 70 (a first electrode) is formed on the P-type diffusion layer 11, a source electrode 71 (a second electrode) is formed on the P-type diffusion layer 12, a source electrode 72 (a second electrode) is formed on the N-type diffusion layer 13, and a source electrode 73 (a second electrode) is formed on the P-type diffusion layer 14. When the diode 20 and the P-channel DMOS transistor 21 are compared, it is seen that the diode 20 is a diode that makes use of the P-channel DMOS structure.

In the P-channel DMOS transistor 21, the N-type buried layer 2 and an N-type epitaxial layer 25 are laminated on the P-type substrate 1. In the N-type epitaxial layer 25, an N-type diffusion layer 26 and a P-type diffusion layer 29 are formed to be isolated from each other. On the N-type diffusion layer 26, an N-type diffusion layer 27 and a P-type diffusion layer 28 are formed adjacent to each other. On the P-type diffusion layer 29, a P-type diffusion layer 31 is formed. The N-type diffusion layer 26, the N-type diffusion layer 27, and the P-type diffusion layer 28 are formed in a source region. The P-type diffusion layer 29 and the P-type diffusion layer 31 are formed in a drain region. The N-type diffusion layer 27, the P-type diffusion layer 28, and the P-type diffusion layer 31 form a shallow and dense diffusion layer. STI 30 is formed adjacent to the P-type diffusion layer 31. A gate electrode 32 is formed between a source section and a drain section and above the N-type epitaxial layer 25 via a not-shown gate insulating film and connected to other circuits.

In the semiconductor device 19, power supply voltage VCC is supplied to the N-type diffusion layer 27 and the P-type diffusion layer 28, which are formed in the source of the P-channel DMOS transistor 21, by a connection line 35 respectively via source electrodes 77 and 78. The source electrodes 77 and 78 are connected to a power supply. The connection line 35 is a power supply line. The P-type diffusion layer 31 formed in the drain of the P-channel DMOS transistor 21 and the P-type diffusion layer 11 formed in an anode (the drain) of the diode 20 are connected via drain electrodes 76 and 70 and a connection line 36. A cathode (a source and a gate) of the diode 20 is connected to a pad 38 as a terminal via a connection line 37. Specifically, the gate electrodes 10 and the source electrodes 71 to 73 of the diode 20 are connected to the pad 38 via the connection line 37.

As shown in FIG. 5, on the P-type substrate 1, two regions isolated by the deep trench isolation (DTI) 18 are formed. A diode 42 according to the first embodiment is mounted on one region. An N-channel DMOS transistor 41 is mounted on the other region. Because the diode 42 is the same as the diode already explained with reference to FIG. 1, the same components are denoted by the same reference numerals and signs and explanation of the components is omitted.

In the N-channel DMOS transistor 41, the N-type buried layer 2 and the N-type epitaxial layer 25 are laminated on the P-type substrate 1. In the N-type epitaxial layer 25, an N-type diffusion layer 43 and a P-type diffusion layer 46 are formed to be isolated from each other. The P-type diffusion layer 46 is equivalent to a source section and the N-type diffusion layer 43 is equivalent to a drain section. On the P-type diffusion layer 46, an N-type diffusion layer 47 and a P-type diffusion layer 48 are formed adjacent to each other. On the N-type diffusion layer 43, an N-type diffusion layer 44 is formed. The P-type diffusion layer 46, the N-type diffusion layer 47, and the P-type diffusion layer 48 are formed in a source region. The N-type diffusion layer 43 and the N-type diffusion layer 44 are formed in a drain region. The N-type diffusion layer 47, the P-type diffusion layer 48, and the N-type diffusion layer 44 form a shallow and dense diffusion layer. STI 45 is formed adjacent to the N-type diffusion layer 44. A gate electrode 49 is formed between the source section and the drain section and above the N-type epitaxial layer 25 via a not-shown gate insulating film and connected to other circuits.

In the semiconductor device 40, the N-type diffusion layer 47 and the P-type diffusion layer 48, which are formed in the source of the N-channel DMOS transistor 41, are grounded (GND) by a connection line 50 respectively via source electrodes 81 and 82. The N-type diffusion layer 44 formed in the drain of the N-channel DMOS transistor 41 and a cathode (a source and a gate) of the diode 42 are connected via a drain electrode 80 and a connection line 51. Specifically, the drain electrode 80 of the N-channel DMOS transistor 41 is connected to the gate electrodes 10 and the source electrodes 71 to 73 of the diode 42 via the connection line 51. The P-type diffusion layer 11 formed in an anode (the drain) of the diode 42 is connected to a pad 53 as a terminal via the drain electrode 70 and the connection line 52.

The configurations shown in FIGS. 4 and 5 can be used in combination. FIG. 6 is a circuit diagram of the configurations used in combination. In FIG. 6, the pad 38 is a plus terminal connected to the anode of the diode 20 and the pad 53 is a minus terminal connected to the cathode of the diode 42. In FIG. 6, for a main purpose of measures against a surge, the diode 20 is interposed between the P-channel (Pch) DMOS transistor 21 and the pad 38 and the diode 42 is interposed between the N-channel (Nch) DMOS transistor 41 and the pad 53. As explained in the first embodiment, the diodes 20 and 42 have characteristics that the diodes 20 and 42 have high withstand voltage and a parasitic current to the P-type substrate 1 is suppressed.

When the diodes 20 and 42 according to the first embodiment are used, there is an effect that a deviation among respective parasitic capacitances that occur when a device is connected to the pad 38 on the cathode side and when a device is connected to the pad 53 on the anode side becomes small. On the other hand, in the past, it is necessary to set parasitic capacitances the same by, for example, changing an area on the cathode side and an area on the anode side.

In FIGS. 4 to 6, the examples in which the diode according to the first embodiment and the DMOS are mixedly mounted on the same substrate are shown. Besides, it is possible to configure a semiconductor device in which the diode is mixedly mounted on the same substrate together with a bipolar transistor, a CMOS transistor, a DMOS transistor, or the like. For example, it is possible to configure a semiconductor device in which the diode is mixedly mounted on the same substrate together with a Bi-DMOS, a Bi-CDMOS, or the like.

Figure 7:
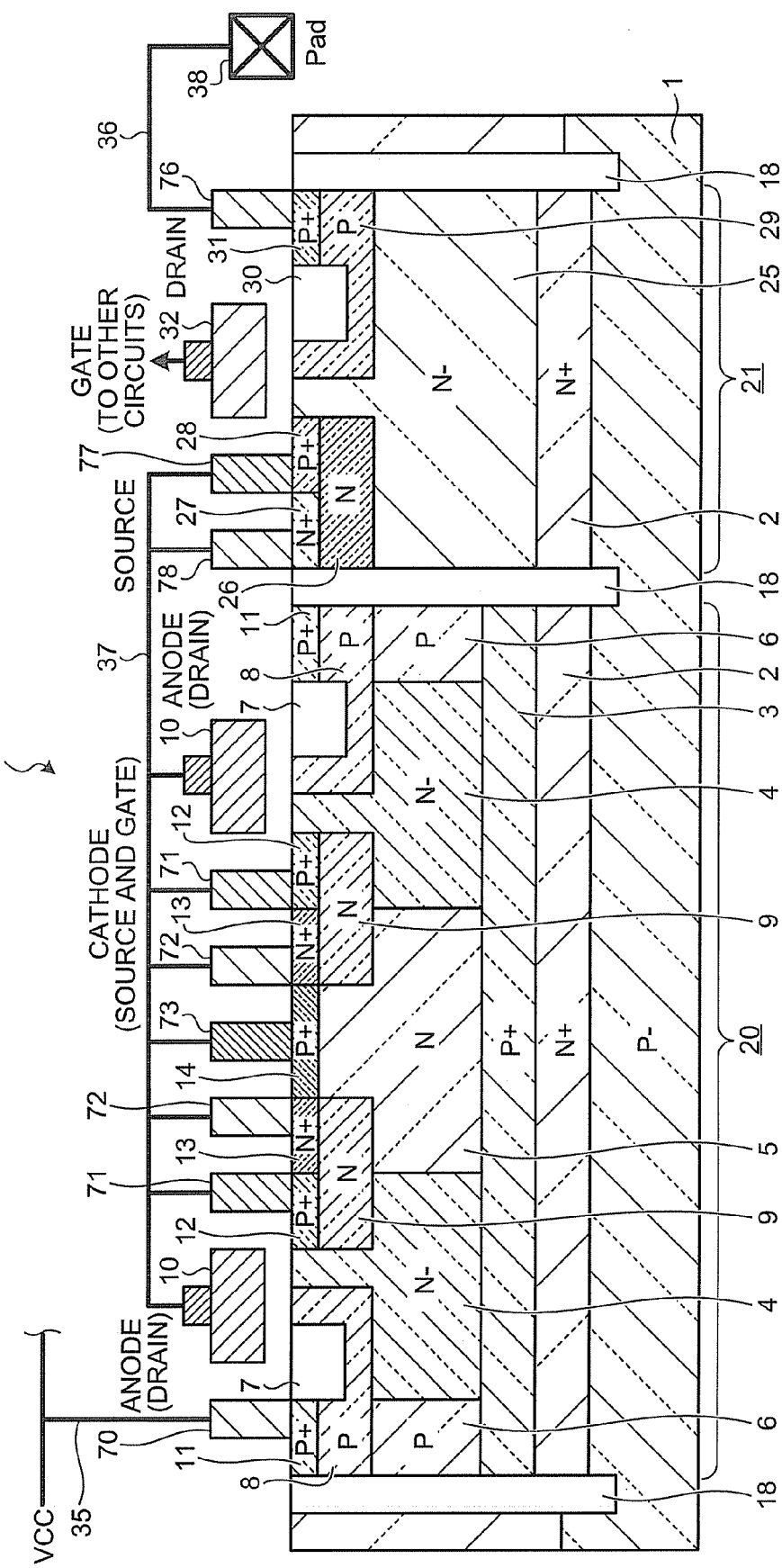
FIG. 7 is a diagram of an example of the sectional configuration of a semiconductor device according to a third embodiment of the present invention.
Figure 8:
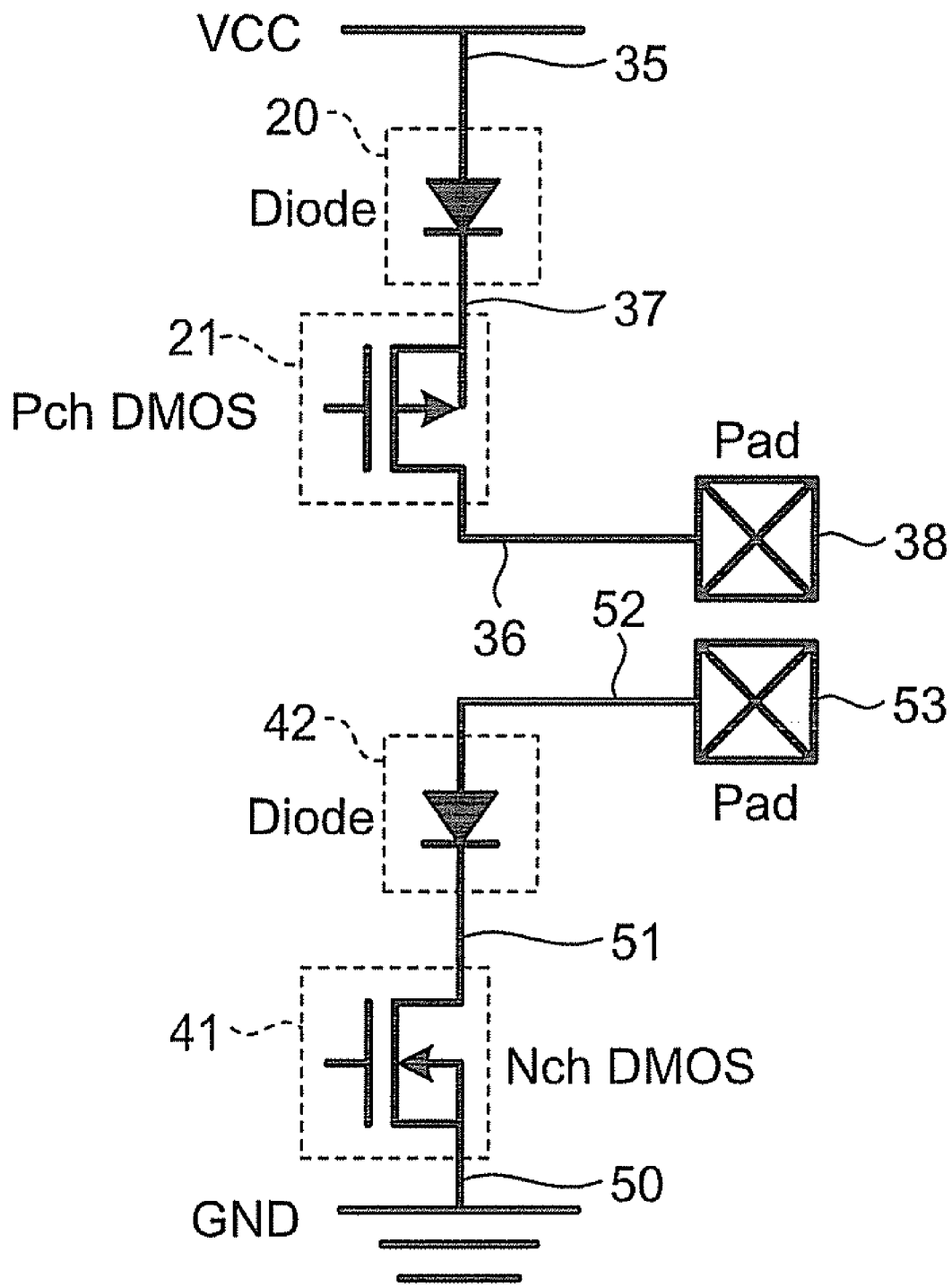
FIG. 8 is a circuit diagram of a configuration obtained by combining the configurations shown in FIGS. 7 and 5.

FIG. 7 is a diagram of an example of the sectional configuration of a semiconductor device according to a third embodiment of the present invention. FIG. 8 is a circuit diagram of a configuration obtained by combining the configurations shown in FIGS. 7 and 5.

As shown in FIG. 7, in a semiconductor device 54, the diode 20 according to the first embodiment and the P-channel DMOS transistor 21 are mixedly mounted on the same P-type substrate 1. In FIG. 7, the diode 20 is connected to a power supply voltage VCC supply side and the P-channel DMOS transistor 21 is connected to the pad 38 side. On the other hand, in FIG. 4, the diode 20 is connected to the pad 38 side and the P-channel DMOS transistor 21 is connected to the power supply voltage VCC supply side. Specifically, in FIG. 7, the diode 20 and the P-channel DMOS transistor 21 are interchanged and connected. This relation is also evident from comparison of circuit diagrams, i.e., FIGS. 8 and 6.

In FIG. 7, the drain electrode 70 of the diode 20 is connected to the connection line 35 as a power supply line. The power supply voltage VCC is supplied to the drain electrode 70. The gate electrodes 10 and the source electrodes 71 to 73 of the diode 20 are connected to the source electrodes 77 and 78 of the P-type channel DMOS transistor 21 via the connection line 37. The drain electrode 76 of the P-type channel DMOS transistor 21 is connected to the pad 38 via the connection line 36.

Other components shown in FIGS. 7 and 8 are the same as those shown in FIGS. 4 and 6. Therefore, the same components are denoted by the same reference numerals and signs and explanation of the components is omitted.

Effects of this embodiment are as explained below. When the diode 20 is connected to the power supply side as shown in FIG. 7, the power supply voltage VCC is applied to the P-type buried layer 3. Therefore, the P-type buried layer 3 and the N-type buried layer 2 are only requested to have small withstand voltage. On the other hand, in FIG. 4, the power supply voltage VCC is supplied to the P-type channel DMOS transistor 21. Therefore, compared with FIG. 7, the P-type buried layer 3 and the N-type buried layer 2 are requested to have higher withstand voltage performance.

In FIG. 4, the gate electrode 10 is directly connected to the pad 38. In this case, it is likely that the gate electrode 10 is broken when a surge flows into the gate electrode 10 via the pad 38. On the other hand, in FIG. 7, such a problem does not occur because the diode 20 is connected to the power supply side.

Figure 9:
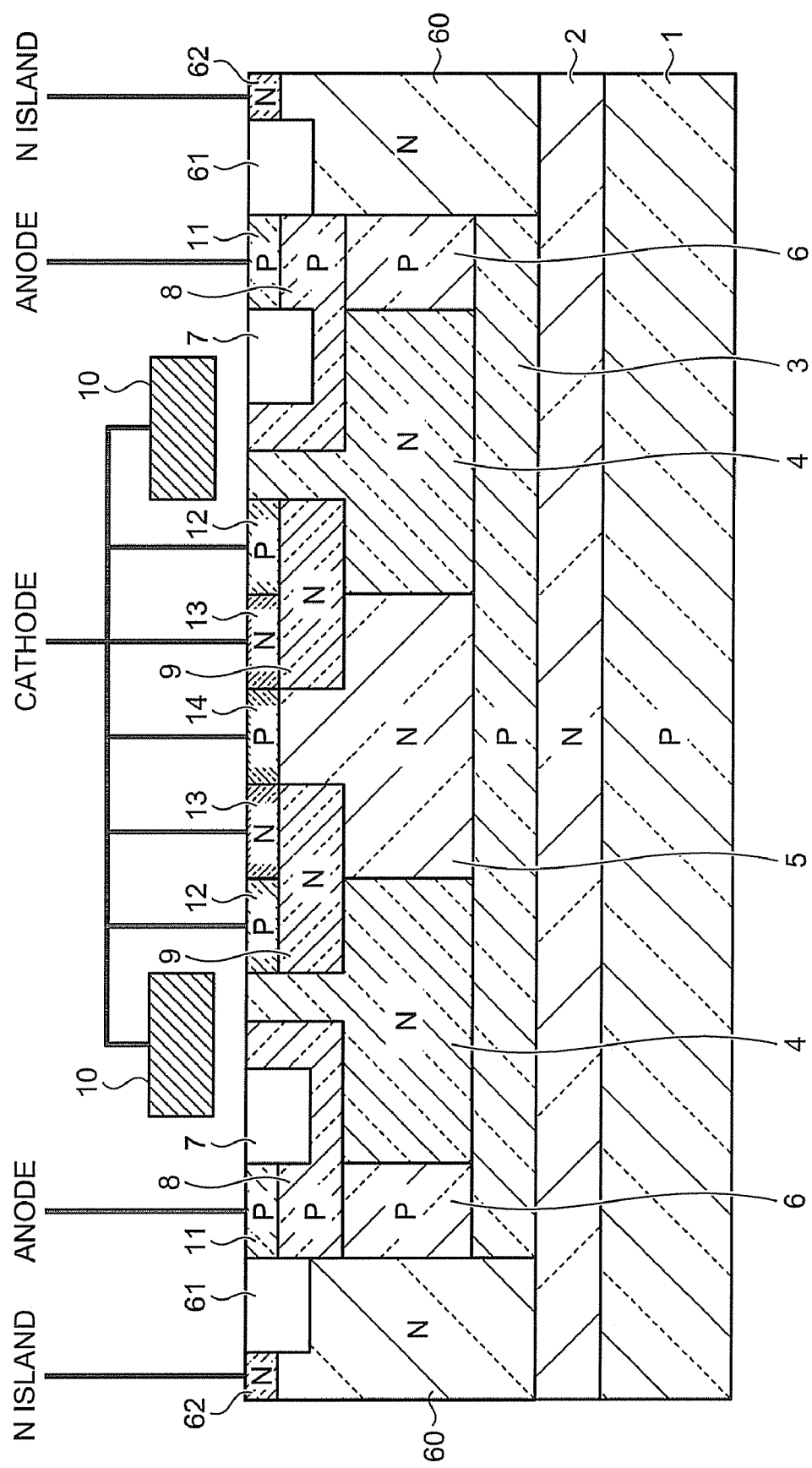
FIG. 9 is a sectional view of the configuration of the semiconductor device according to the third embodiment in which a diode is formed on a substrate by making use of a P-channel DMOS structure.

FIG. 9 is a sectional view of the configuration of a semiconductor device according to a fourth embodiment of the present invention. The configuration of a diode formed on a substrate by making use of the P-type channel DMOS structure is shown in FIG. 9.

As shown in FIG. 9, in this embodiment, the P-type substrate 1, the N-type buried layer 2 formed on the P-type substrate 1, and the P-type channel DMOS structure formed on the P-type buried layer 3 and explained in the first embodiment are the same as those shown in FIG. 1. Therefore, in FIG. 9, component same as those shown in FIG. 1 are denoted by the same reference numerals and signs and detailed explanation of the components is omitted.

In FIG. 9, N-type semiconductor layers 60 are formed further on the outer side of the drain section (the anode) shown in FIG. 1 to surround the drain section. Specifically, the N-type semiconductor layers 60 are formed on the N-type buried layer 2 to surround the P-type region including the P-type buried layer 3, the P-type diffusion layers 6, the P-type diffusion layers 8, and the P-type diffusion layers 11. The N-type semiconductor layers 60 are specifically N-type epitaxial layers or N-type diffusion layers. In the N-type semiconductor layers 60, STI 61 and a shallow N-type diffusion layers 62 having high impurity concentration are formed. Connection lines are led out from the N-type diffusion layers 62. The N-type semiconductor layers 60 and the N-type diffusion layers 62 are N-type semiconductor regions formed to extend from the surface of the N-type buried layer 2 to the surface of a device formation region.

The N-type diffusion layers 62 and the N-type semiconductor layers 60 form islands of N-type regions (N islands) together with the N-type buried layer 2. High potential is applied from the N-type diffusion layers 62 and the N-type semiconductor layers 60 to the N-type buried layer 2 through connection lines, which are connected to the N-type diffusion layers 62 via not-shown electrodes, to set the potential of the N-type buried layer 2 to be higher than the potential of the P-type buried layer 3 and the P-type substrate 1. Consequently, an electric current is suppressed from passing from the P-type buried layer 3 to the P-type electrode 1 through the N-type buried layer 2 because of characteristics of PN connection.

According to this embodiment, because the diode is formed by making use of the DMOS, withstand voltage of which depends on the parameters in the horizontal direction (the width direction of the substrate), it is possible to provide a diode that guarantees high withstand voltage by adjusting the parameters in the horizontal direction. Therefore, unlike the past, the withstand voltage of the diode formed on the substrate does not depend on the parameters in the vertical direction (the thickness direction of the substrate), in particular, the thickness of the diffusion layers. Consequently, the problem in that the thickness of the device has to be increased to secure high withstand voltage is prevented.

In this embodiment, the N-type buried layer 2 and the P-type buried layer 3 are laminated on the P-type substrate 1, high potential is applied to the N-type buried layer 2, and the P-type region of the anode and the N-type region of the cathode are isolated from the P-type substrate 1. Therefore, it is possible to suppress a parasitic current flowing to the P-type substrate 1 and provide a diode in which leakage of an electric current to the P-type substrate 1 is suppressed.

According to this embodiment, even when there is a negative input to the terminal of the anode, because the N-type buried layer 2 kept at high potential is present between the P-type substrate 1 and the diode, an electric current is suppressed from passing from the P-type substrate 1 to the terminal.

Other components, operations, and effects of this embodiment are the same as those in the first embodiment. The diode according to this embodiment can also be formed as a device together with a DMOS and the like as in the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a substrate of a first conductivity type;
    a first buried layer of a second conductivity type that is formed in a device formation region on the substrate and is in a floating state;
    a second buried layer of the first conductivity type formed on the first buried layer;
    an epitaxial layer of the second conductivity type formed on the second buried layer;
    a first diffusion region of the first conductivity type that are formed on the second buried layer and surround the epitaxial layer;
    a second diffusion region of the first conductive type, at least a part of which is formed on the first diffusion region;
    a third diffusion region of the first conductivity type formed on the second diffusion region;
    a first electrode formed on the third diffusion region;
    a fourth diffusion region of the second conductivity type, at least a part of which is formed in the epitaxial layer;
    a fifth diffusion region of the first conductivity type and a sixth diffusion region of the second conductivity type formed on the fourth diffusion region;
    a second electrode formed on the fifth diffusion region and the sixth diffusion region; and
    a third electrode formed between the third diffusion region and the fifth diffusion region and above the epitaxial layer via an insulating film, and short-circuited with the fifth diffusion region and the sixth diffusion region via the second electrode.

2. The semiconductor device according to claim 1, further comprising:
    a seventh diffusion region of the second conductivity type formed to be surrounded by the epitaxial layer; and
    an eighth diffusion region of the first conductivity type formed on the seventh diffusion region, wherein
    the second electrode is formed on the eighth diffusion region.

3. The semiconductor device according to claim 2, wherein the fourth diffusion region is formed to extend over the epitaxial layer and the seventh diffusion region.

4. The semiconductor device according to claim 2, wherein
    a pair of the second diffusion regions, a pair of the third diffusion regions, a pair of the fourth diffusion regions, a pair of the fifth diffusion regions, and a pair of the sixth diffusion regions are formed in the device formation region, and
    the eighth diffusion region is arranged between the pair of the sixth diffusion regions.

5. The semiconductor device according to claim 1, wherein the second diffusion region is formed to extend from the first diffusion region to an upper portion inside the epitaxial layer.

6. The semiconductor device according to claim 1, wherein a first trench is formed adjacent to the third diffusion region in the second diffusion region.

7. The semiconductor device according to claim 1, wherein
    a second trench extending to the substrate is formed to surround the device forming region, and
    the device formation region is isolated from the other regions on the substrate by the second trench.

8. The semiconductor device according to claim 7, wherein
    the semiconductor device is mixedly mounted on the same substrate together with a DMOS transistor having a channel of the first conductivity type,
    a source electrode of the DMOS transistor is connected to a power supply line,
    a drain electrode of the DMOS transistor and the first electrode are connected, and
    the second and third electrodes are connected to a first pad.

9. The semiconductor device according to claim 7, wherein
    the semiconductor device is mixedly mounted on the same substrate together with a DMOS transistor having a channel of the first conductivity type,
    the first electrode is connected to a power supply line,
    a source electrode of the DMOS transistor is connected to the second and third electrodes, and
    a drain electrode of the DMOS transistor and a first pad are connected.

10. The semiconductor device according to claim 7, wherein
    the semiconductor device is mixedly mounted on the same substrate together with a DMOS transistor having a channel of the second conductivity type,
    a source electrode of the DMOS transistor is grounded,
    a drain electrode of the DMOS transistor are connected the second and third electrodes, and
    the first electrode and a second pad are connected.

11. The semiconductor device according to claim 1, wherein the semiconductor device is mixedly mounted on the same substrate together with a DMOS, a Bi-DMOS, or a Bi-CDMOS.

12. The semiconductor device according to claim 1, wherein the first conductivity type is P type and the second conductivity type is N type.

* * * * *